United States Patent [19]
Cline et al.

[11] 3,990,093  
[45] Nov. 2, 1976

[54] DEEP BURIED LAYERS FOR SEMICONDUCTOR DEVICES

[75] Inventors: Harvey E. Cline; Thomas R. Anthony, both of Schenectady, N.Y.

[73] Assignee: General Electric Company, Schenectady, N.Y.

[22] Filed: Feb. 26, 1975

[21] Appl. No.: 553,170

Related U.S. Application Data

[63] Continuation of Ser. No. 411,014, Oct. 30, 1973, abandoned.

[52] U.S. Cl. .................................... 357/60; 357/23; 357/55; 357/68; 148/1.5; 357/89; 357/90
[51] Int. Cl.² .................. H01L 29/78; H01L 29/06; H01L 29/04; H01L 23/48

[58] Field of Search .................. 357/60, 23, 55, 68, 357/89, 90

[56] References Cited
UNITED STATES PATENTS

| | | | |
|---|---|---|---|
| 3,370,184 | 2/1968 | Zuleeg | 357/60 |
| 3,681,668 | 8/1972 | Kobayashi | 357/60 |

*Primary Examiner*—Edward J. Wojciechowicz  
*Attorney, Agent, or Firm*—Donald M. Winegar; Joseph T. Cohen; Jerome C. Squillaro

[57] ABSTRACT

A deep buried electrical layer is provided in a semiconductor device by thermal gradient zone melting.

39 Claims, 5 Drawing Figures

U.S. Patent     Nov. 2, 1976     3,990,093 ial. A layer of semiconductor material of suitable type
DEEP BURIED LAYERS FOR SEMICONDUCTOR DEVICES This is a continuation, of application Ser. No. 411,014, filed Oct. 30, 1973, now abandoned.

BACKGROUND OF THE INVENTION

1. Field of the Invention

This invention relates to buried electrically conductive layers of metal in semiconductor devices and a method of forming the same.

2. Background of the Invention

Deep buried electrically conductive layers of metal are required in some electrical devices, particularly in some integrated circuits to serve as an electrical contact to semiconductor regions remotely located from exposed major surfaces. Heretofore, one practice of forming such a buried electrical layer is to form the region by diffusion in a body of semiconductor material. A layer of semiconductor material of suitable type conductivity is grown on the body and the diffused region to obtain the buried layer. Circuitry is then formed in the body and the newly grown material and the buried region employed for electrical contacting as required.

However, the prior art practices involve practices which inherently introduce contaminents which degrade the physical properties of the buried layer and the material of the body. In particular, contaminents are introduced by undesirable impurities in the material employed for diffusion and for growing semiconductor materials.

An object of this invention is to provide a new and improved buried electrically conductive metal layer in a body of semiconductor material which overcomes deficiencies of the prior art.

Another object of this invention is to provide a new and improved method for providing a buried electrically conductive metal layer in a body of semiconductor material.

Other objects of this invention will, in part, be obvious and will, in part, appear hereinafter.

BRIEF DESCRIPTION OF THE INVENTION

In accordance with the teachings of this invention there is provided a semiconductor device comprising a body of semiconductor material having a first type conductivity, a selected resistivity and two major opposed surfaces. A layer of electrically conductive metal is disposed entirely within the body between the two major opposed surfaces. The first region has at least one major surface. A region of recrystallized semiconductor material of the body having solid solubility of the electrically conductive metal is disposed in the body. The region has two opposed end surfaces and extends between one major surface and the first region of electrically conductive metal. One end surface is coextensive with the at least one major surface of the first region. The other opposed end surface is coextensive with the one major surface of the layer. The conductivity type of the region may be intrinsic, the same as the body or of the opposite type than the body.

DESCRIPTION OF THE INVENTION

Figure 1:
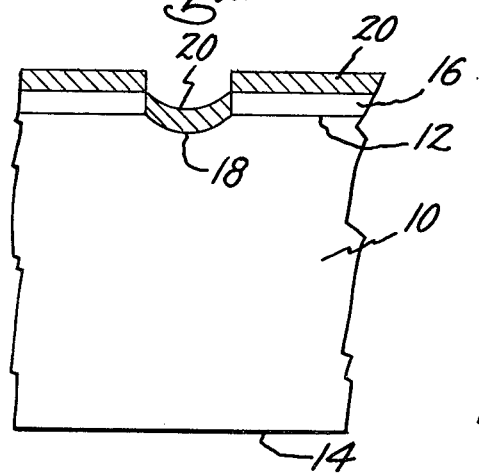
FIGS. 1 through 4 is an elevation view, in cross-section, of a body of semiconductor device being processed in accordance with the teachings of this invention.

With reference to FIG. 1, there is shown a body 10 of semiconductor material having a selected resistivity and a first type conductivity. The body 10 has opposed major surface 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III and a Group V element.

The body 10 is mechanically polished, chemically etched to remove any damaged surfaces, rinsed in deionized water and dried in air. An acid resistant mask 15 is disposed on the surface 12 of the body 10. Preferably, the mask is of silicon oxide which is either thermally grown or vapor deposited on the surface 14 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80°C. A suitable mask defining one or more geometrical shapes such, for example, as a circle or a square is disposed on the layer of photoresist and exposed to ultraviolet light. After exposure, the layer of photoresist is washed in xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution (NH$_4$F—HF). The etching is continued until a second set of windows corresponding to the windows of the photoresist mask are opened in the layer 16 of silicon oxide to expose select portions of the surface 12 of the body 10 of silicon. The processed body 10 is rinsed in deionized water and dried. The remainder of the photoresist mask is removed by immersion in concentrated sulphuric acid at 180° C or immersion in a solution of 1 part of hydrogen peroxide and 1 part of concentrated sulphuric acid immediately after mixing.

Selective etching of the exposed surface of areas of body 10 is accomplished with a mixed acid solution. The mixed acid solution is 10 parts by volume nitric acid 70%, 4 parts by volume acetic acid, 100%, and 1 part by volume hydrofluoric acid, 48%. At a temperature of from 20° to 30° C, the mixed acid solution selectively etches the silicon of the body 10 at a rate of approximately 5 microns per minute. A depression 18 is etched in the surface 12 of the body 10 beneath each window of the oxide layer 16. The selective etching is continued until the depth of the depression 18 is approximately equal to the width of the window in the silicon oxide layer 16. However, it has been discovered, that the depression 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a depression 18 of from 25 to 30 microns in depth for a window or diameter of from 10 to 500 microns. The etched body 10 is rinsed in distilled water and blown dry. Preferably, as gas such, for example, as freon, argon and the like, is suitable for drying the processed body 10.

The depression may be semi-hemispherical in configuration for the thermomigration of a droplet or of a trough-like configuration for the thermomigration of a metal "wire".

The processed body 10 is disposed in a metal evaporation chamber. A metal layer 20 is deposited on the remainining portions of the layer 16 of silicon oxide and on the exposed silicon in the depression 18. The metal in the depression 18 is the metal droplet or "wire" to be migrated through the body 1. The metal of the layer 20 comprises a material, either substantially pure in itself or suitably doped by one or more materials to impart a second and opposite type conductivity to the materials of the body 10 through which it migrates. The thickness of the layer 20 is approximately equal to the depth of the depressions 18 which is preferably 20 microns deep. Therefore, the layer 20 is approximately 20 microns in thickness. A suitable material for the metal layer 20 is aluminum to obtain P-type regions in N-type silicon semiconductor material. Prior to migrating the metal droplet or wire in the depressions 18 through the body of silicon 10, the excess metal of the layer 20 is removed from the silicon oxide layer 16 by such suitable means as grinding away the excess metal with a 600 grit carbide paper or by selective etching.

It has been discovered that the vapor deposition of the layer 20 of aluminum metal should be performed at a pressure of approximately $1 \times 10^{-5}$ torr but not less than $5 \times 10^{-5}$ torr. When the pressure is greater than $3 \times 10^{-5}$ torr, we have found that in the case of aluminum metal deposited in the depression 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

Figure 2:
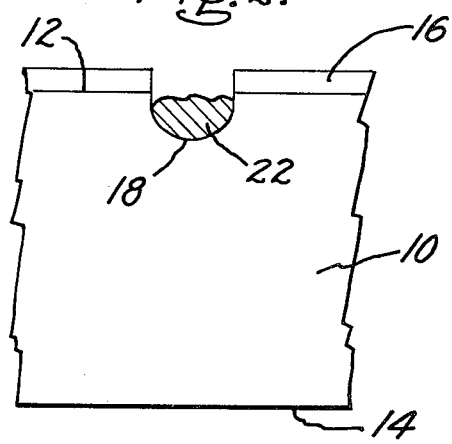

Referring now to FIG. 2, the processed body 10 is placed in a thermomigration apparatus, not shown, and the metal in the depression 18 forms a droplet 22 of metal-rich alloy of the material of the body 10 in each etched area of surface 12 and is thermomigrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 of from 700° to 1350° C. The process is practiced for a sufficient length of time preferably in a vacuum of an inert atmosphere of hydrogen, helium, argon and the like to thermomigrate the metal-rich droplet 22 through the body 10 to a predetermined depth beneath the surface 12. For example, for aluminum metal of 20 microns thickness, a thermal gradient of 50° C/centimeter, a temperature of the body 10 of 1100° C a pressure of $1 \times 10^{-5}$ torr, a furnace time of less than 10 minutes is required to migrate the metal-rich droplet 22 through a silicon body 10 to a depth of 5 mils beneath the surface 12.

Figure 3:
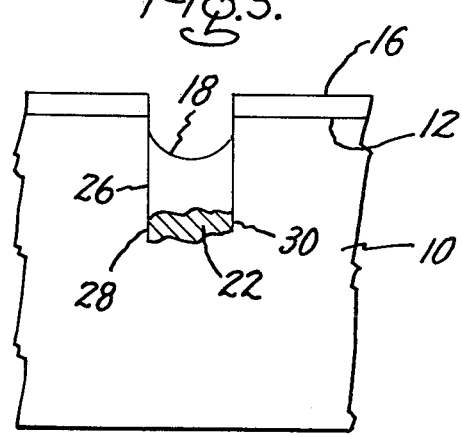

Upon reaching the desired depth beneath the surface 12 as determined by the time of thermomigration at a specific temperature range and thermal gradient, the process is stopped and the body cooled. The droplet 22 solidifies within the body 10 as shown in FIG. 3.

As the droplet or wire 22 thermomigrated through the body 10 it formed a region 24 of recrystallized material of the body 10 having solid solubility of the metal 20 therein and of P-type conductivity. A P-N junction 26 is formed by the contiguous surfaces of the region 24 and the body 10.

Figure 4:
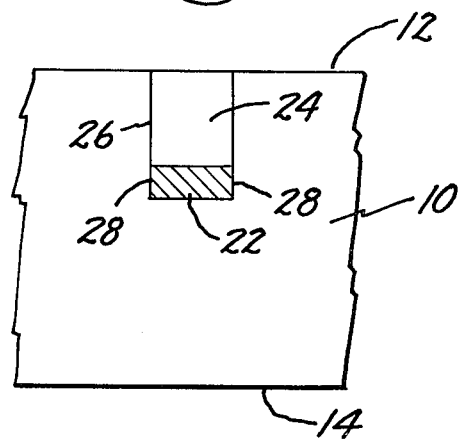

The droplet 22 when solidified within the body 10 produces regions of high stress at its corners 28 and 30 thereof which may cause premature failure of any P-N junction formed in the vicinity of the metallic droplet in the body 10. The temperature is not sufficient to cause an appreciable lateral displacement of the P-N junction 26. The final structure of the completed device is as shown in FIG. 4 after appropriate processing of the body 10 to remove the oxide mask 16 and the selective portion of the surface 12. The process is controllable. An array of droplets 0.010 in diameter spaced 0.020 inch on center was successfully thermomigrated 0.080 inch into a body 10 of N-type silicon. The region 26 was doped substantially constant throughout and had an impurity dopant concentration of $2 \times 10^{19}$ atoms per cubic centimeter.

Aluminum is considered an active material in that it is a metal which is also a p-type dopant material. Consequently, as described before, aluminum forms a P-type conductivity region in N-type conductivity semiconductor material. Gallium and indium are also metals which may be employed in place of aluminum and which will also provide a p-type conductivity 26 in the body 10 of N-type conductivity.

In instances wherein the body 10 is of P-type conductivity, the structure as shown in FIG. 4 may be achieved through the use of appropriate materials. For example, an alloy of tin and antimony produces an N-type region in P-type semiconductor material.

Figure 5:
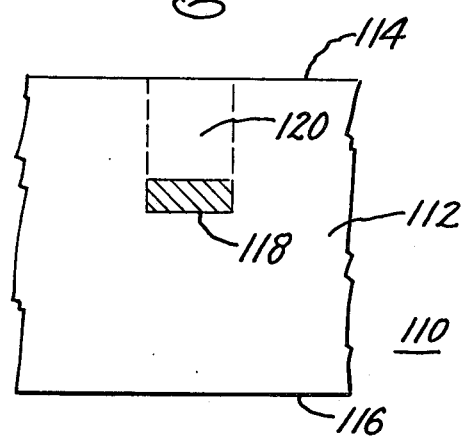
FIG. 5 is an elevation view, in cross-section, of an alternate embodiment of this invention.

Referring now to FIG. 5, there is shown a semiconductor device 110 which is an alternate embodiment of this invention. The device 110 comprises a body 112 of semiconductor material, the material being the same as those for the body 10. The body 112 has first type conductivity a selective resistivity, and two major surfaces 114 and 116 which, respectively, are the top and bottom surfaces thereof. A layer 118 of metal is disposed in the body 112 by the thermal gradient zone melting process of this invention. A region 120 of recrystallized material of the body 10 having solid solubility of the metal of the layer 118 is formed by the process. The region 120 has the same type conductivity as the body 112 or it has an intrinsic, neither P or N-type conductivity. The metal materials described before with the appropriate type conductivity of the body 112 to obtain the structure as shown.

To obtain a region 126 wherein the conductivity is substantially intrinsic, one may thermomigrate tin or lead into the body 10 to form the layer 118. Gold and platinum when thermomigrated through the body 10 will also form the layer 118 but, gold and platinum are well known lifetime killers and proper precautions must be exercised. However, the gold and the platinum are kept within the boundaries of the region 26 because of process temperatures employed and do not detrimentally affect the remainder of the material of the body 10.

In all instances, a high dopant level of the region 26 is achieved and an excellent low electrical resistance path is provided from the surface 12 or 114 to the respective layers 22 and 118.

It has been discovered that when the body 10 is of silicon, germanium, silicon carbide, gallium arsenide semiconductor material and the like, the migrating metal droplet 22 has a preferred shape which also gives rise to the region 26 being of the same shape as the migrating droplet 22. In a crystal axis direction of < 111 > of thermal migration, the droplet 22 migrates as a triangular platelet laying in a (111) plane. The platelet is bounded on its edges by (112) planes. A droplet 22 larger than 0.10 centimeter on an edge is unstable and breaks up into several droplets during migration. A droplet 22 smaller than 0.0175 centimeter may not migrate into the body 10 because of a surface barrier problem.

The ratio of the droplet migration rate over the imposed thermal gradient is a function of the temperature at which thermomigration of the droplet 22 is practiced. At high temperatures, of the order of from 1000° to 1400° C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicone system, the droplet migration rate decreases by a factor of two when the droplet volume is decreased by a factor of 200.

A droplet 22 thermomigrates in the < 100 > crystal axis direction as a pyramidal bounded by four forward (111) planes and a rear (100) plane. Careful control of the thermal gradient and migration rate is a necessity. Otherwise, a twisted region 26 may result. It appears that there is a nonuniform dissolution of the four forward (111) facets in that they do not always dissolve at a uniform rate. Non-uniform dissolution of the four forward (111) facets may cause the regular pyramidal shape of the droplet to become distorted into a trapezoidal shape.

For a more thorough understanding of the temperature gradient zone melting process and the apparatus employed for the process, one is directed to our copending applications entitled Method of Making Deep Diode Devices, Ser. No. 411,150; Deep Diode Device Production and Method, Ser. No. 411,021; Deep Diode Devices and Method and Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stabilized Droplet Method of Making Deep Diodes Having Uniform Electrical Properties, Ser. No. 411,008 filed concurrently with this patent application and assigned to the same assignee of this invention.

The regions of recrystallized material exhibit substantially theoretical physical values which are dependent upon the materials involved. Various materials may be thermomigrated into the body 10 or 112 to provide various configurations therein.

The invention has been described relative to practicing thermal gradient zone melting in a negative atmosphere (a vacuum). However, it has been discovered that when the body of semiconductor material is a thin wafer of the order of 10 mil thickness, the thermal gradient zone melting process may be practiced in an inert gaseous atmosphere of hydrogen, helium, argon and the like, in a furnace having a positive atmosphere.

The thermomigration of metal wires is preferably practiced in accordance with the planar orientations, thermomigration directions and stable wire sizes of Table I.

Table I

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (110) | <110> | <1$\bar{1}$0>* | <150 microns |
| (111) | <111> | (a) <01$\bar{1}$> |  |
|  |  | <10$\bar{1}$> | <500 microns |
|  |  | <1$\bar{1}$0> |  |
|  |  | (b) <11$\bar{2}$*>* |  |
|  |  | <$\bar{2}$11> | <500 microns |
|  |  | <1$\bar{2}$1>* |  |
|  |  | (c) Any other* Direction in (111) plane* | <500 microns |

*The stability of the migrating wire is sensitive to the alignment of the thermal gradient with the <100>, <110> and <111> axis, respectively.
+Group a is more stable than group b which is more stable than group c.

We claim as our invention:
1. A semiconductor device comprising
a body of semiconductor material having a first type conductivity, a predetermined level of resistivity, a vertical axis aligned substantially with a first preferred crystal axis of the material of the body and two major opposed surfaces which are, respectively, the top and bottom surfaces of the body, at least one of the major surfaces having a preferred planar crystal orientation which is one selected from the group consisting of (100), (110) and (111);
a layer of electrically conductive metal disposed entirely within the body between, and parallel with the two major opposed surfaces and having at least one major surface, and
a region consisting of recrystallized semiconductor material of the body having solid solubility of at least the electrically conductive metal therein disposed in the body and extending between one opposed major surface of the body and the major surface of the layer of metal, and having a vertical axis aligned substantially with the first preferred crystal axis of the material of the body and two opposed end surfaces, one end surface is coextensive with the major surface of the body and the other end surface is coextensive with the at least one major surface of the layer, the region having a predetermined type conductivity which is one selected from the group consisting of P-type, N-type and intrinsic and a predetermined level of resistivity, wherein
the metal layer and the region are formed in situ by the migration of a melt of metal-rich semiconductor material of the body through the body of predetermined distance from that major surface by thermal gradient zone melting at a predetermined elevated temperature along a thermal gradient substantially parallel with the vertical axes of the body and the region, and terminating the migration of the melt at that predetermined distance into the body and solidifying the melt to form the region having a substantially uniform distribution of the metal throughout the entire region, the level of concentration of the metal being determined by the solid solubility limit of that metal in that semiconductor material at that predetermined elevated temperature of migration and to also form the metal layer, the metal comprising at least one dopant impurity material to impart the predetermined type conductivity and level of resistivity to the region.

2. The semiconductor device of claim 1 wherein the preferred planar crystal orientation is (111), and the first preferred crystal axis is < 111 >.

3. The semiconductor device of claim 2 wherein the material of the body is one selected from the group consisting of silicon, silicon carbide, germanium and gallium arsenide.

4. The semiconductor device of claim 3 wherein the metal of the layer is one selected from the group consisting of aluminum, gallium, indium and an alloy of tin and antimony.

5. The semiconductor device of claim 4 wherein the semiconductor material is silicon, and the metal is aluminum.

6. The semiconductor device of claim 1 wherein the preferred planar crystal orientation is (100), and the first preferred crystal axis is < 100 >.

7. The semiconductor device of claim 6 wherein the semiconductor material is one selected from the group consisting of silicon, silicon carbide, germanium and gallium arsenide.

8. The semiconductor device of claim 7 wherein the metal of the layer is one selected from the group consisting of aluminum, gallium, indium and an alloy of tin and antimony.

9. The semiconductor device of claim 8 wherein the semiconductor material is silicon, and the metal is aluminum.

10. The semiconductor device of claim 1 wherein the preferred planar crystal orientation is (110), and the first preferred crystal axis is < 110 >.

11. The semiconductor device of claim 10 wherein the semiconductor device is one selected from the group consisting of silicon, silicon carbide, germanium and gallium arsenide.

12. The semiconductor device of claim 11 wherein the metal of the layer is one selected from the group consisting of aluminum, gallium, indium and an alloy of tin and antimony.

13. The semiconductor device of claim 12 wherein the semiconductor material is silicon, and the metal is aluminum.

14. The semiconductor device of claim 1 wherein the body and the region have the same type conductivity.

15. The semiconductor device of claim 14 wherein the semiconductor material is one selected from the group consisting of silicon, silicon carbide, germanium and gallium arsenide.

16. The semiconductor type device of claim 15 wherein the metal of the layer is one selected from the group consisting of aluminum, gallium, indium and an alloy of tin and antimony.

17. The semiconductor device of claim 16 wherein the semiconductor material is silicon, and the metal is aluminum.

18. The semiconductor device of claim 1 wherein the body and region have different and opposite type conductivity, and including a P-N junction formed by the contiguous surfaces of the material of the abutting region and the body.

19. The semiconductor device of claim 18 wherein the semiconductor material is one selected from the group consisting of silicon, silicon carbide, germanium and gallium arsenide.

20. The semiconductor device of claim 19 wherein the metal of the layer is one selected from the group consisting of aluminum, gallium, indium and an alloy of tin and antimony.

21. The semiconductor device of claim 20 wherein the semiconductor material is silicon, and the metal is aluminum.

22. The semiconductor device of claim 1 wherein the region and the layer each have a planar configuration and is aligned substantially parallel with a second preferred axis of the material of the body.

23. The semiconductor device of claim 22 wherein the preferred planar crystal orientation is (100), the first preferred crystal axis is < 100 >, and the preferred second crystal axis is one selected from the group consisting of < 011 > and < 011 >.

24. The semiconductor device of claim 23 wherein the material of the body is one selected from the group consisting of silicon, silicon carbide, germanium and gallium arsenide.

25. The semiconductor device of claim 24 wherein the metal of the layer is one selected from the group consisting of aluminum, gallium, indium and an alloy of tin and antimony.

26. The semiconductor device of claim 25 wherein the semiconductor material is silicon, and the metal is aluminum.

27. The semiconductor device of claim 23 wherein the material of the body is silicon, silicon carbide, germanium and gallium arsenide.

28. The semiconductor device of claim 22 wherein the preferred planar crystal orientation is (110), the first preferred crystal axis is < 110 >, and the second preferred crystal axis is < 110 >.

29. The semiconductor device of claim 28 wherein the material of the body is one selected from the group consisting of silicon, silicon carbide, germanium and gallium arsenide.

30. The semiconductor device of claim 29 wherein the metal of the layer is one selected from the group consisting of aluminum, gallium, indium and an alloy of tin and antimony.

31. The semiconductor device of claim 30 wherein the semiconductor material is silicon, and the metal is aluminum.

32. The semiconductor device of claim 22 wherein the preferred planar crystal orientation is (111), and the first preferred crystal axis is < 111 >.

33. The semiconductor device of claim 32 wherein the material of the body is one selected from the group consisting of silicon, silicon carbide, germanium and gallium arsenide.

34. The semiconductor device of claim 33 wherein the metal of the layer is one selected from the group consisting of aluminum, gallium, indium and an alloy of tin and antimony.

35. The semiconductor device of claim 34 wherein the semiconductor material is silicon, and the metal is aluminum.

36. The semiconductor device of claim 32 wherein the second preferred crystal axis is one selected from the group consisting of $<01\bar{1}>$, $<10\bar{1}>$, $<1\bar{1}0>$, $<11\bar{2}>$, $<\bar{2}11>$ and $<1\bar{2}1>$.

37. The semiconductor device of claim 36 wherein the semiconductor material is one selected from the group consisting of silicon, silicon carbide, germanium and gallium arsenide.

38. The semiconductor device of claim 37 wherein the metal of the layer is one selected from the group consisting of aluminum, gallium, indium and an alloy of tin and antimony.

39. The semiconductor device of claim 38 wherein the semiconductor material is silicon, and the metal is aluminum.

* * * * *